United States Patent
Hara et al.

[11] Patent Number: 5,994,937
[45] Date of Patent: Nov. 30, 1999

[54] TEMPERATURE AND POWER SUPPLY ADJUSTED ADDRESS TRANSITION DETECTOR

[75] Inventors: Takahiko Hara, Wappingers Falls, N.Y.; Khandker Nazrul Quader, Sunnyvale, Calif.; Yohji Watanabe, Kanagawa, Japan

[73] Assignees: International Business Machines Corporation, Armonk, N.Y.; Kabushiki Kaisha Toshiba, Kanagawa-ken, Japan

[21] Appl. No.: 08/744,810

[22] Filed: Nov. 6, 1996

[51] Int. Cl.$^6$ .................................................. H03H 11/26
[52] U.S. Cl. .................................................. 327/262
[58] Field of Search .................................. 327/172–174, 327/262–264, 276–278, 280, 281, 284–285, 287–288, 341, 362, 539, 512, 513, 541; 323/315

[56] References Cited

U.S. PATENT DOCUMENTS

| | | | |
|---|---|---|---|
| 4,661,928 | 4/1987 | Yasuoka | 365/189 |
| 4,806,804 | 2/1989 | O'Leary | 327/277 |
| 4,821,003 | 4/1989 | Kameya | 333/139 |
| 4,899,071 | 2/1990 | Morales | 327/277 |
| 5,061,907 | 10/1991 | Rasmussen | 331/57 |
| 5,081,380 | 1/1992 | Chen | 327/262 |
| 5,164,621 | 11/1992 | Miyamoto | 327/264 |
| 5,180,995 | 1/1993 | Hayashi et al. | 331/57 |
| 5,303,191 | 4/1994 | Eagan et al. | 365/194 |
| 5,319,607 | 6/1994 | Fujii et al. | 365/233.5 |
| 5,453,709 | 9/1995 | Tanimoto et al. | 327/276 |
| 5,600,281 | 2/1997 | Mori et al. | 331/57 |

Primary Examiner—My-Trang Nuton
Attorney, Agent, or Firm—Schmeiser, Olsen & Watts; H. Daniel Schnurmann

[57] ABSTRACT

According to the preferred embodiment of the present invention, an ATD pulse generating mechanism is provided that overcomes the limitations of the prior art by compensating for process and power supply voltage variations that would normally effect the pulse width. In particular, the delays used to create the pulse width are adjusted to compensate for the effects of process and environmental variations, thereby providing a pulse width that is relatively constant over these variations.

15 Claims, 4 Drawing Sheets

TEMPERATURE AND POWER SUPPLY ADJUSTED ADDRESS TRANSITION DETECTOR

BACKGROUND OF THE INVENTION

1. Technical Field

This invention generally relates to semiconductor devices, and more specifically relates to timing circuits in semiconductor memory systems.

2. Background Art

Many modern semiconductor devices use timing signals that require accurate pulse widths. Unfortunately, as the operating speed of modern devices increases, the required pulse width often narrows and the task of maintaining an accurate pulse width becomes more difficult. This is especially true where temperature, voltage and process variations potentially affect the signal pulse width.

Most modern memory systems use an address transistor detector (ATD) to control the memory circuits such that their evaluation efficiency is maximized. On detecting an address transition, the ATD provides an ATD signal that comprises a pulse or set of pulses. This ATD signal is used to equalize, preset and/or recover the timing critical circuits of the semiconductor memory system, resulting in faster access times. The pulse width of these ATD signals is critical. If the pulse width is too short, it can lead to incorrect data. If the pulse width is too long, the access time may be pushed out (i.e., increased).

Turning now to FIG. 1, FIG. 1 is a portion of a prior art ATD pulse generator 100. ATD pulse generator 100 comprises a plurality of delay elements, including delay elements 102 and 104, a plurality of logic circuits, including logic circuit 106, and an ATD sum 108. The ATD pulse generator receives a plurality of address signals ADDR(i) (e.g., ADDR(1)) and plurality of address signal complements ADDRbar(i) (e.g., ADDRbar(1)) and uses these address signals to create an ATD pulse signal. Typically, the ATD pulse generator 100 receives each address signal in the memory system. For simplicity, FIG. 1 illustrates only the ADDR(1) inputs, with the ADDR(2) to ADDR(i) inputs not shown. The address signals and address signal complements are each split and sent through an ADDR(1) delay element 102 and an ADDRbar(1) delay element 104 resulting in ADDR(1)DLY an ADDRbar(1)DLY signals. The resulting four signals are inputted to an logic circuit 106. The logic circuit 106 performs an exclusive OR operation on each set of two signals and then performs an OR operation on the results. This results in an ATD(1) signal that is outputted to ATD sum 108.

Similar elements create ATD(2) through ATD(i) and these signals are all inputted to ATD sum 108. ATD sum 108 is preferably a full CMOS or ratioed NOR device. Thus, ATD sum 108 "ORs" the ATD(i) signals, creating the final ATD signal.

Turning now to FIG. 3, FIG. 3 is a waveform diagram of various signals in ATD pulse generator 100. The waveforms include two address signals (ADDR(1) and ADDR(2)) and their complements. Also shown are two delayed address signals (ADDR(1)DLY and ADDR(2)DLY) and their complements. Of course, in an actual ATD device, many more address signals (ADDR(3)–ADDR(i)) would be used to create the ATD signal.

ADDR(1), ADDR(1)DLY and their complements are inputted into a logic circuit 106 which outputs an ATD(1) signal. Likewise, ADDR(2), ADDR(2)DLY and their complements are inputted into a logic circuit (not shown in FIG. 1) which outputs an ATD(2) signal. As shown in FIG. 3, the ATD(i) signals have a pulse width that is a function of the delay through the various delay elements (e.g., 102, 104). These ATD(i) signals, are summed together by ATD sum 108.

Thus, the ATD pulse width is determined by the amount of delay through the delay elements. The accuracy of the pulse width is then a function of the accuracy of the delay elements.

Turning now to FIG. 2, FIG. 2 is a schematic view of delay element 200. The delay element 200 is a typical prior art delay that is used in ADDR delay 102 and ADDRbar delay 104 of FIG. 1. Delay element 200 comprises strings of inverters 202 with capacitors 204 in between. The delay through the inverters 202 determines the width of the ATD pulse. Unfortunately, the use of inverters 202 to determine the ATD pulse width has the disadvantage of creating pulse widths that can vary with process and environmental changes. Specifically, because the delay through inverters is a function of process variations, temperature and power supply voltage, the final pulse width of the ATD signal will also fluctuate with those parameters. Without the ability to control the effects of this variation, the ATD pulse width cannot be accurately provided, especially where a short ATD pulse width is required. Thus, this variation can limit the performance of the memory system.

To try and compensate for this problem, some prior art approaches for optimizing ATD pulse width includes trimming the ATD pulse width during fabrication to compensate for process variations. This solution however, does not compensate for variations in the power supply voltage and operating temperature of the memory system. Other solutions have used longer pulse widths to compensate for variations. Unfortunately, this approach comes at the expense of access time and is not an optimal solution.

Therefore, there existed a need to provide an improved mechanism for providing an accurate ATD signal having an optimized pulse width that avoids the limitations and problems of the prior art.

DISCLOSURE OF INVENTION

According to the present invention, a ATD pulse generating mechanism is provided that overcomes the limitations of the prior art by compensating for process and power supply voltage variations that would normally effect the pulse width. In particular, the delays used to create the pulse width are adjusted to compensate for the effects of process and environmental variations, thereby providing a pulse width that is relatively constant over these variations.

The foregoing and other features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

The preferred embodiment of the present invention provides a pulse generator that overcomes the limitations of the prior art. In particular, the pulse generator comprises a delay element that provides consistent delay by compensating for process and power supply voltage variations that would normally change the delay. For example, in the prior art, as the temperature of the pulse generator decreased, the delay through the delay elements would also decrease, and could result in too narrow a pulse width. In a pulse generator in accordance with the preferred embodiment, a temperature dependent current source controlled by a reference voltage $V_{REF}$ is used to mitigate the effects of such a temperature decrease by increasing the delay through the delay elements.

Figure 1:
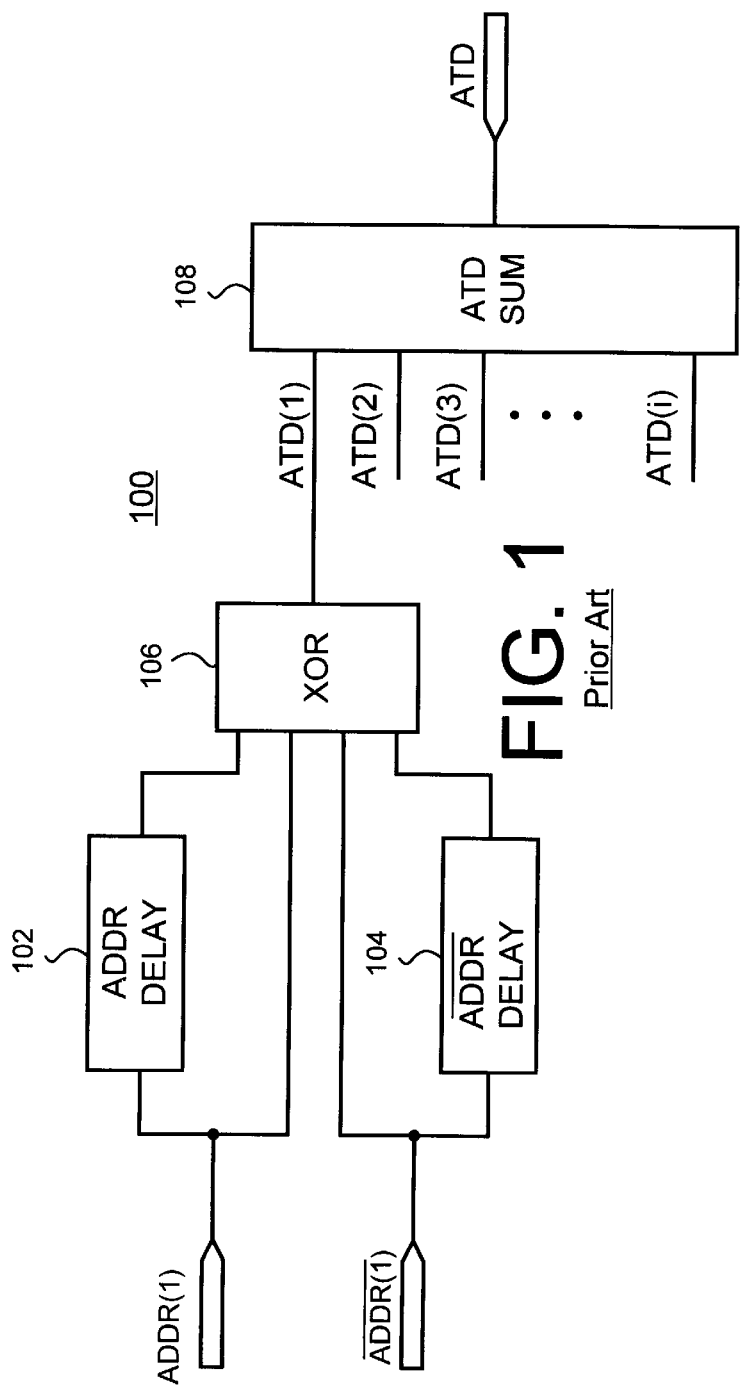
FIG. 1 is schematic view of a portion of a prior art ATD pulse generator 100.
Figure 2:
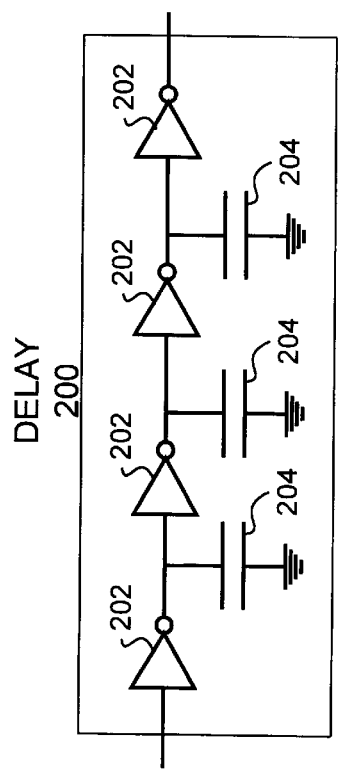
FIG. 2 is a schematic view of a prior art delay element 200.
Figure 3:
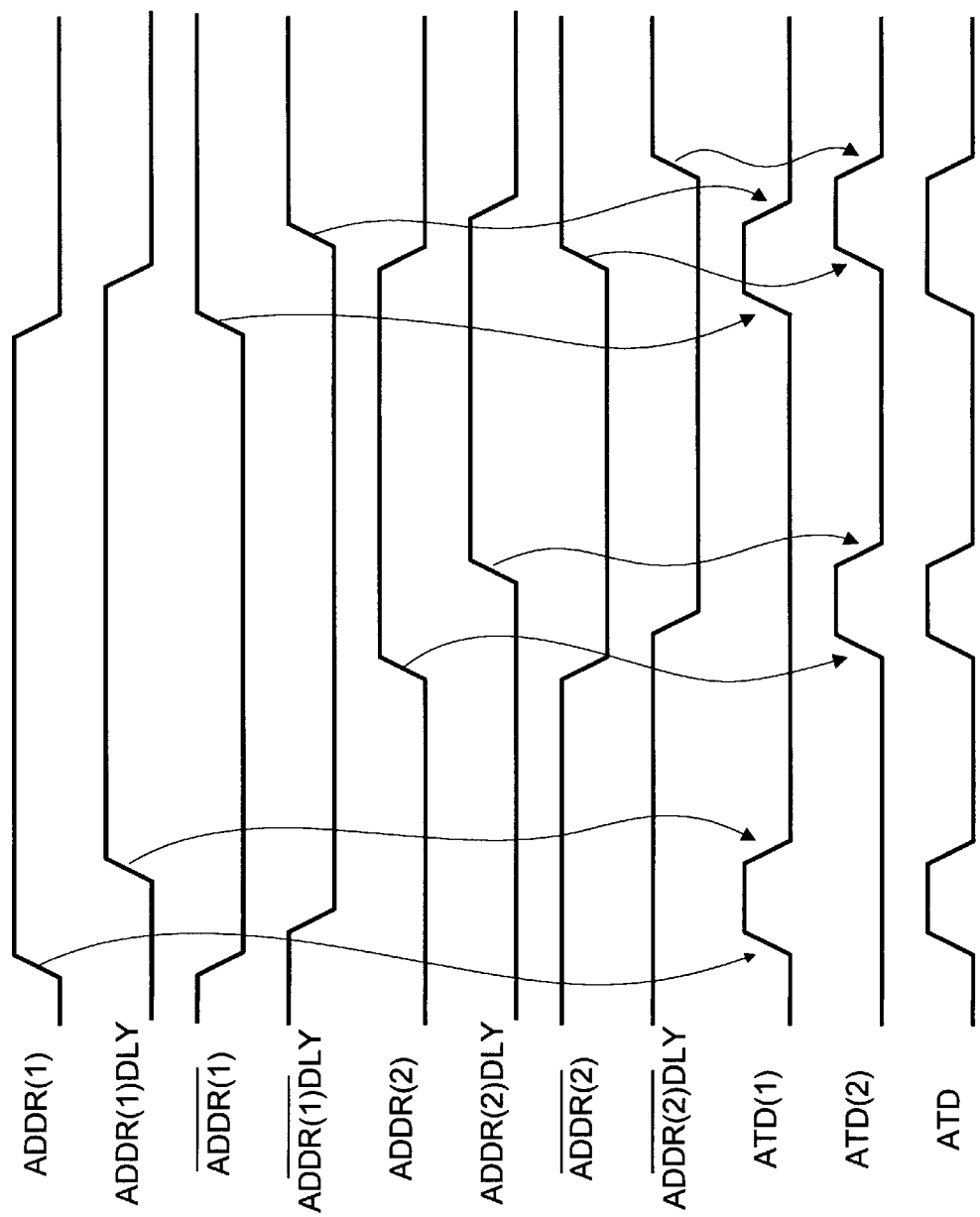
FIG. 3 is a waveform diagram of various signals in ATD pulse generator 100.
Figure 4:
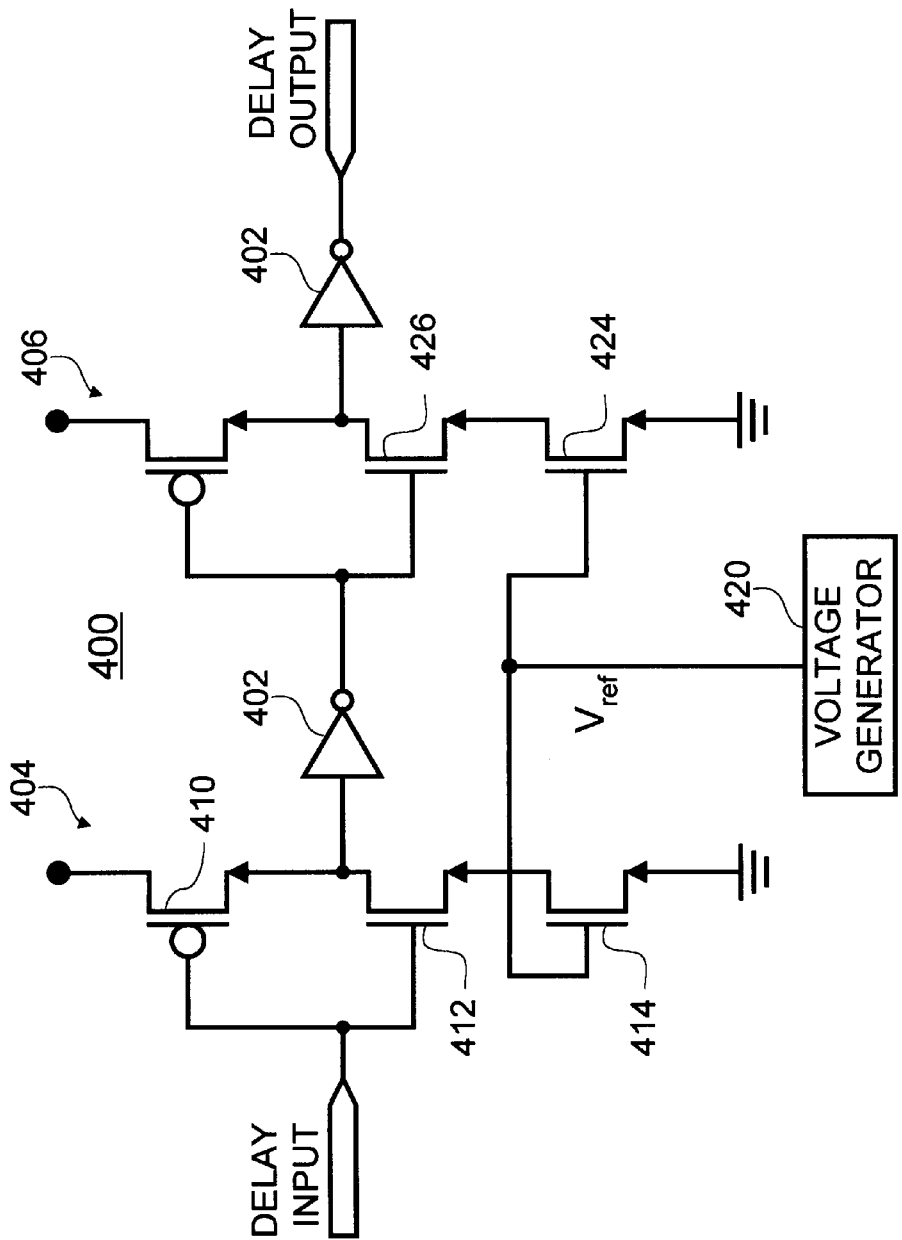
FIG. 4 is a schematic view of a delay element 400 in accordance with the preferred embodiment of the present invention.

Turning now to FIG. 4, FIG. 4 is a schematic view of a delay element 400 in accordance with the preferred embodiment of the present invention. The delay element 400 can be used as delay elements 102 and 104 of FIG. 1, providing a more accurate pulse generation.

The delay element 400 comprises two conventional inverters 402 and two compensated inverters 404 and 406. Together, the four inverters provide a delay from input to output of delay element 400.

Compensated inverter 404 comprises a P-FET 410, an N-FET 412 and an N-FET 414. A reference voltage $V_{REF}$ is supplied to the gate of N-FET 414 from voltage generator 420. The compensated inverter 404 operates as follows: the reference voltage $V_{REF}$ controls the maximum amount of current that can flow through N-FET 414. Thus, as $V_{REF}$ increases or decreases, the current that can flow through N-FET 412 and N-FET 414 increases or decreases respectively.

The delay through inverter 404 is dependent upon the maximum current that can flow through N-FETs 412 and 414 during signal transition. Thus, when $V_{REF}$ increases N-FET 412 and N-FET 414 increase their current, causing the delay through inverter 404 to shorten. Likewise, when $V_{REF}$ decreases, the current through N-FETs 412 and 414 decreases, causing the delay through inverter 404 to increase. Thus, the N-FET 414 acts as a temperature dependent current source controlled by a reference voltage $V_{REF}$. Voltage generator 420 varies $V_{REF}$ with temperature to compensate for temperature-induced changes in the delay of inverter 404, thereby maintaining a relatively constant delay through inverter 404 over a wide temperature range.

$V_{REF}$ controls the delay through inverter 406 in a like manner. In particular, adjusting $V_{REF}$ adjusts the current through N-FET 424 and N-FET 426. Thus, by adjusting the reference voltage $V_{REF}$ the delay through the delay element 400 can be adjusted to compensate for temperature and other variations. This allows for the ATD pulse width to be kept constant over a wide range of temperature and power supply voltage variations.

In the preferred embodiment, two inverters in the prior art delay circuit are replaced with compensated invertors. In particular, those inverters that provide delay where the input makes a transition from low to high are replaced. Those skilled in the art will recognize that the other inverters could be similarly replaced if desired or necessary.

Figure 5:
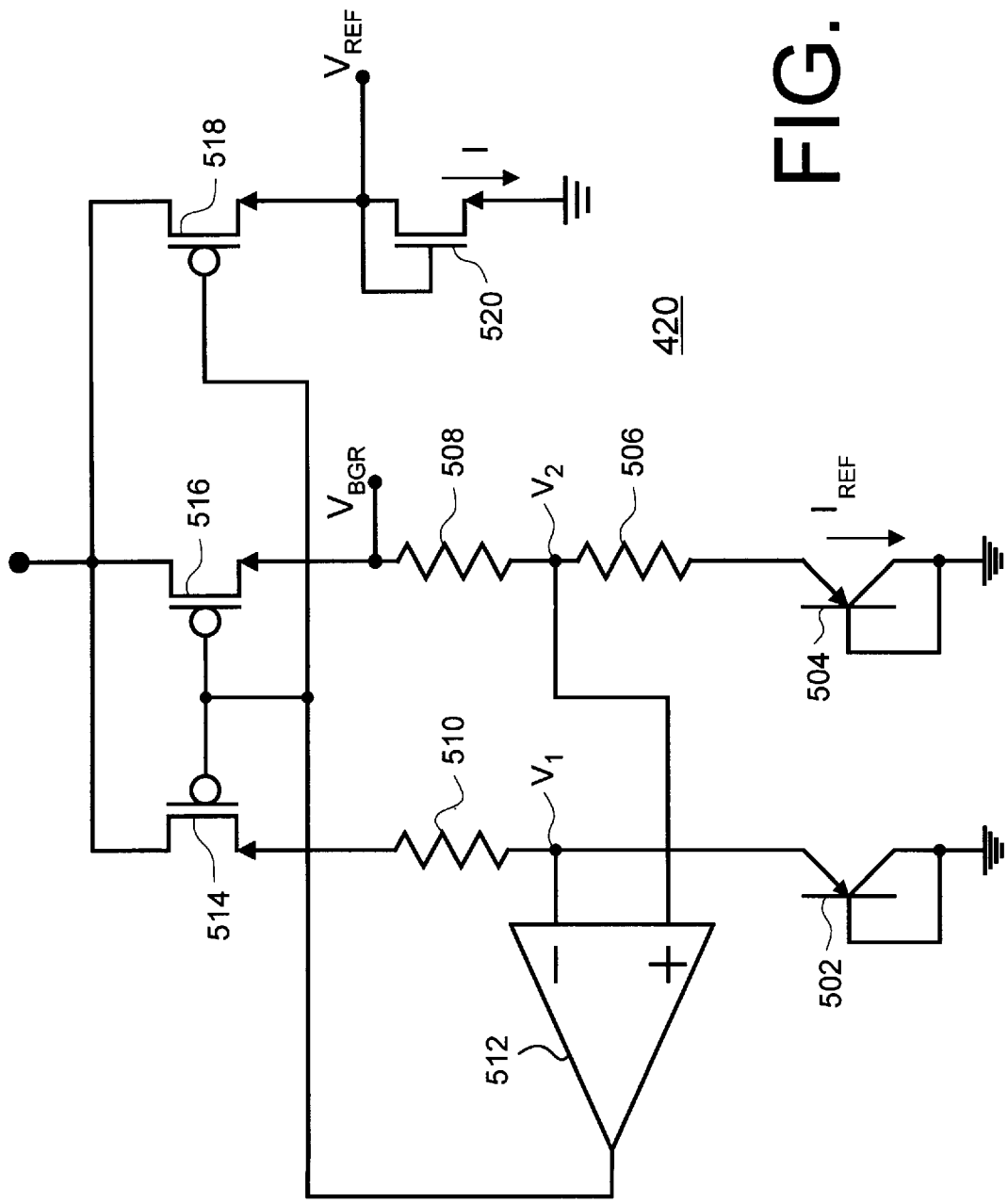
FIG. 5 is a schematic view of a reference voltage generator 420 in accordance with the preferred embodiment of the present invention.

Turning now to FIG. 5, FIG. 5 is a schematic view of a voltage generator 420. The voltage generator 420 is designed to provide reference voltage $V_{REF}$ for the compensated inverters 404 and 406 of FIG. 4. In one embodiment, the voltage generator 420 is a modified band gap reference circuit. Band gap reference circuits are commonly used to provide an accurate band gap reference voltage $V_{BGR}$ for a wide variety of applications. The voltage generator 420 has been modified to provide a reference voltage $V_{REF}$ for the compensated inverters 404 and 406 in addition to the $V_{BGR}$. Thus, in applications where a band gap reference voltage $V_{BGR}$ is required, a voltage generator 420 can provide $V_{BGR}$ in addition to $V_{REF}$ with only a relatively small amount of additional circuitry.

The voltage generator 420 comprises a first diode coupled transistor 502, a second diode coupled transistor 504: resistors 506, 508 and 510; a differential amplifier 512; a plurality of P-FETs 514, 516 and 518; and an N-FET 520.

The diode coupled transistors 502 and 504 are selected to provide an accurate voltage drop based on the semiconductor band gap. Diode coupled transistor 504 has preferably ten times the semiconductor area as diode coupled transistor 502, and hence ten times the emitter current density. Differential amplifier 512 controls the current flowing through P-FETs 514 and 516 such that the voltage levels $V_1$ and $V_2$ at its input become equal. This causes a reference current, $I_{REF}$ to flow through diode coupled transistor 504. If P-FETs 514 and 516 are identical, two resistors 508 and 510 should also be identical, resulting in the current through the diode transistors 502 and 504 being the same.

Based upon the current equation for diode coupled transistors, the reference current $I_{REF}$ is as follows:

$$I_{REF} = \frac{kT \ln(X)}{qR}$$

where k is Boltzmann's constant, T is temperature in degrees Kelvin, q is an electron's charge, R is the resistance of resistor 506 and X is the ratio of emitter current density in transistors 504 and 502 (preferably 10). Thus, if the resistor 506 is selected to have resistance R with no temperature dependence, the current $I_{REF}$ flowing through diode coupled transistor 504 is proportional to ambient temperature. The current $I_{REF}$ is mirrored through P-FETs 516 and 518, causing a current I to flow through N-FET 520. If P-FETs 516 and 518 are identical, current I will be equal to $I_{REF}$. If P-FETs 516 and 518 are different, current I and $I_{REF}$ will have different values, but the ratio of currents I/$I_{REF}$ will be kept constant. Since the current $I_{REF}$ is proportional to temperature, current I is also proportional to temperature.

Where $V_{BGR}$ is to be used as a reference voltage by other circuits, resistors 508 and 510 are preferably selected to have ten times the resistance of resistor 506 to effectively eliminate a temperature dependence of the $V_{BGR}$.

Returning to FIG. 4, with $V_{REF}$ connected to the gates of N-FETs 414 and 424, the current I of FIG. 5 will be mirrored from N-FET 520 into the inverters 404 and 406. The current flowing through inverters 404 and 406 will then be proportional to the temperature in the same way that the current I is. In particular, as the temperature goes down the mirrored current through inverters 404 and 406 will decrease as well. Thus, the voltage generator 420 is designed to provide a reference voltage $V_{REF}$ adapted to reduced the drive to N-FETs 414 and 424 (of FIG. 4) at lower temperatures. This reduces the change in the delay element's delay that would normally occur at lower temperatures, hence reducing the amount of pulse width variation that would normally occur at such a temperature.

Furthermore, since the current I does not depend on the transistor characteristics, the mirrored currents flowing through the N-FETs 414 and 424 do not vary even if the process parameters (i.e., threshold voltage Vt) vary as long as the mirror FETS (414, 424, and 520) all experience the same process. In order to improve this mirror effect, it is preferable to choose the same gate length for all FETS which make up the current mirror so that a gate length variation gives those FETS the same current variation in ratio.

In general the maximum ATD pulse width occurs in slow conditions, such as high temperature, low power supply voltage, and long response due to process variations. In the prior art, the pulse width narrows as conditions speed up, such as lower temperature, higher power supply voltage and shorter response due to process variations. Because the preferred embodiment compensates for the effects of faster conditions, the ATD pulse generator can be designed to have a minimum but adequate pulse width at slow conditions without having too narrow a pulse width under fast conditions. This improves the speed at which the device can be designed to operate. In particular, VREF is used to assure that the ATD pulse width does not overly narrow and is adequate under fast conditions.

While the invention has been particularly shown and described with reference to a preferred exemplary embodiment thereof, it will be understood by those skilled in the art that various changes in form and details may be made therein without departing from the spirit and scope of the invention. It will be also understood that, while various of the conductors are shown in the drawing as single lines, they are not so shown in a limiting sense, and may comprise plural conductor, as is understood in the art.

We claim:

1. A circuit for generating a pulse having a pulse width, the circuit comprising:
   a) at least one delay element, said delay element comprising at least one compensated inverter, said compensated inverter having a propagation delay that at least partially defines said pulse width and wherein said propagation delay can be adjusted by means of a reference voltage; and
   b) a reference voltage generator for generating said reference voltage, wherein said generator adjusts said reference voltage to compensate the propagation delay of said compensated inverter for temperature variations.

2. The circuit of claim 1 wherein said reference voltage generator comprises a first diode, said first diode in series with a substantially temperature independent impedance, said impedance and said first diode having a reference current proportional to temperature, said reference current being mirrored to create said reference voltage.

3. The circuit of claim 2 wherein said reference voltage generator further comprises a second diode, said second diode having one tenth the semiconductor area of said first diode.

4. The circuit of claim 3 further comprising an amplifier, said amplifier driving said first and second diodes such that the current $I_{REF}$ flowing though said first diode comprises $$I_{REF} = \frac{kT \ln(X)}{qR}$$

where k is Boltzmann's constant, T is temperature in degrees Kelvin of said address transition detector, q is an electron's charge, R is the resistance of said impedance, and X is ratio of emitter current density in said first diode to said second diode.

5. The circuit of claim 1 wherein said delay element comprises two inverters and two compensated inverters.

6. The circuit of claim 1 wherein said reference voltage adjusts to reduce the drive of said delay elements when said temperature variations comprise a temperature decrease.

7. The circuit of claim 1 wherein said reference voltage adjusts to increase the drive of said delay elements when said temperature variations comprise a temperature increase.

8. The circuit of claim 1 wherein said circuit comprises an address transition detector and wherein said pulse comprises an address transition detector pulse.

9. An address transition detector pulse generator for generating address transition detector pulses each having a pulse width, the address transition detector pulse generator comprising:
   a) a plurality of delay elements, said plurality of delay elements partially defining said pulse width of said address transition detector pulses, each of said plurality of delay elements comprising a plurality of compensated inverters, said compensated inverters having a propagation delay that partially defines said pulse width and wherein said propagation delay can be adjusted by means of a reference voltage; and
   b) a reference voltage generator for generating said reference voltage, said reference voltage generator comprising a first diode in series with a substantially temperature independent impedance, said impedance and said first diode having a reference current proportional to temperature and wherein said reference current is mirrored to create said reference voltage.

10. The address transition detector of claim 9 wherein said voltage generator further comprises a second diode and an amplifier, said amplifier having an first input tied to the input of said first diode through said temperature independent impedance and a second input tied to said second diode and having an output driving a first transistor, a second transistor and a third transistor, said first transistor providing current to said first diode, said second transistor providing current to said second diode, and said third transistor mirroring current into said compensated inverters of said delay elements.

11. The address transition detector of claim 9 wherein current provided to said first diode comprises a current $I_{REF}$, wherein the current $I_{REF}$ comprises:

$$I_{REF} = \frac{kT \ln(X)}{qR}$$

where k is Boltzinann's constant, T is temperature in degrees Kelvin of said address transition detector, q is an electron's charge, R is the resistance of said impedance and X is a constant.

12. A method for compensating for the effects of temperature variations on propagation delay in a pulse generating circuit, the method comprising the steps of:
   a) providing a plurality of delay elements, each of said plurality of delay elements comprising at least one compensated inverter, said compensated inverter having a propagation delay that partially defines the pulse width and wherein said propagation delay can be adjusted by means of a reference voltage; and
   b) adjusting said reference voltage to compensate the propagation delay of said inverter for temperature variations.

13. The method of claim 12 wherein the step of adjusting said reference voltage comprises providing a reference current $I_{REF}$ flowing through a diode and an impedance, wherein said reference current $I_{REF}$ comprises:

$$I_{REF} = \frac{kT \ln(X)}{qR}$$

where k is Boltzmann's constant, T is temperature in degrees Kelvin of said address transition detector mechanism, q is an electron's charge, R is the resistance of said impedance and X is a constant.

14. The method of claim 12 wherein the step of adjusting said reference voltage to compensate said inverter for temperature variations comprises reducing the drive of said delay elements when said temperature variations comprise a temperature decrease.

15. The method of claim 12 wherein the step of adjusting said reference voltage to compensate said inverter for temperature variations comprises increasing the drive of said delay elements when said temperature variations comprise a temperature increase.

* * * * *